(12) United States Patent
Stockmaster et al.

(10) Patent No.: US 11,509,274 B2
(45) Date of Patent: Nov. 22, 2022

(54) AUTOMATIC GAIN CONTROL SYSTEM FOR PROCESSING OF CLIPPED SIGNAL SAMPLES

(71) Applicant: BAE Systems Information and Electronic Systems Integration Inc., Nashua, NH (US)

(72) Inventors: Michael H. Stockmaster, Cedar Rapids, IA (US); Ryan D. Downey, Cedar Rapids, IA (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 0 days.

(21) Appl. No.: 17/224,701

(22) Filed: Apr. 7, 2021

(65) Prior Publication Data

US 2022/0329223 A1 Oct. 13, 2022

(51) Int. Cl.

| | | |
|---|---|---|
| H03H 7/30 | (2006.01) | |
| H03H 7/40 | (2006.01) | |
| H03K 5/159 | (2006.01) | |
| H03G 3/30 | (2006.01) | |
| H03H 17/02 | (2006.01) | |
| H04B 1/16 | (2006.01) | |
| H03H 17/00 | (2006.01) | |

(52) U.S. Cl.
CPC ............ *H03G 3/30* (2013.01); *H03H 17/02* (2013.01); *H04B 1/16* (2013.01); *H03H 2017/0081* (2013.01)

(58) Field of Classification Search
CPC .. H03G 3/30; H03H 17/02; H03H 2017/0081; H04B 1/16; H04L 25/03038
USPC .................................... 375/232–235, 350
See application file for complete search history.

(56) References Cited

U.S. PATENT DOCUMENTS

| 8,644,369 B1* | 2/2014 | Katic ................ H04L 25/03038 |
| | | 375/232 |
| 2008/0218395 A1* | 9/2008 | Tomioka ............... H03M 1/202 |
| | | 341/155 |

OTHER PUBLICATIONS

International Search Report, PCT/US2022/023424, dated May 4, 2022, 10 pages.

* cited by examiner

*Primary Examiner* — Phuong Phu
(74) *Attorney, Agent, or Firm* — Finch & Maloney PLLC; Gary McFaline

(57) ABSTRACT

Techniques are provided for automatic gain control processing to reduce adverse effects associated with clipped samples resulting from conversion of analog signals to digital signals. A methodology according to an embodiment includes identifying a clipped sample of the digital signal, for example by comparison of the digitized sample values to a threshold value associated with a full scale value of the converter. The method also includes applying a window function to portions of the digital signal. The window function is configured to attenuate samples of the digital signal within a region centered on the identified clipped sample. A Hilbert finite impulse response (FIR) filter may be applied to the digital signal prior to applying the window function. Parameters of the window function are selected based on frequency response characteristics of the FIR filter and on signal to noise ratio requirements of an application that receives the windowed digital signal.

17 Claims, 7 Drawing Sheets

Comparison of zeroing versus windowing
500

Frequency response of signal
510

AUTOMATIC GAIN CONTROL SYSTEM FOR PROCESSING OF CLIPPED SIGNAL SAMPLES

FIELD OF DISCLOSURE

The present disclosure relates to automatic gain control (AGC), and more particularly, to AGC processing to reduce adverse effects associated with clipped samples.

BACKGROUND

Many systems employ analog to digital converters (ADCs) to convert an analog signal to digital samples for subsequent processing in the digital domain. The digital signal samples that are generated by the ADCs are limited to some fixed number of bits which corresponds to the maximum or full scale value that can be converted. For example, an X volt analog signal may be mapped to the maximum value that can be represented by an N bit digital signal. If an analog signal exceeds X volts, the ADC will clip the resulting digital sample to the full scale value. The clipping causes unwanted distortion that can be detrimental to, or otherwise impair, the performance of subsequent signal processing stages.

Figure 1:
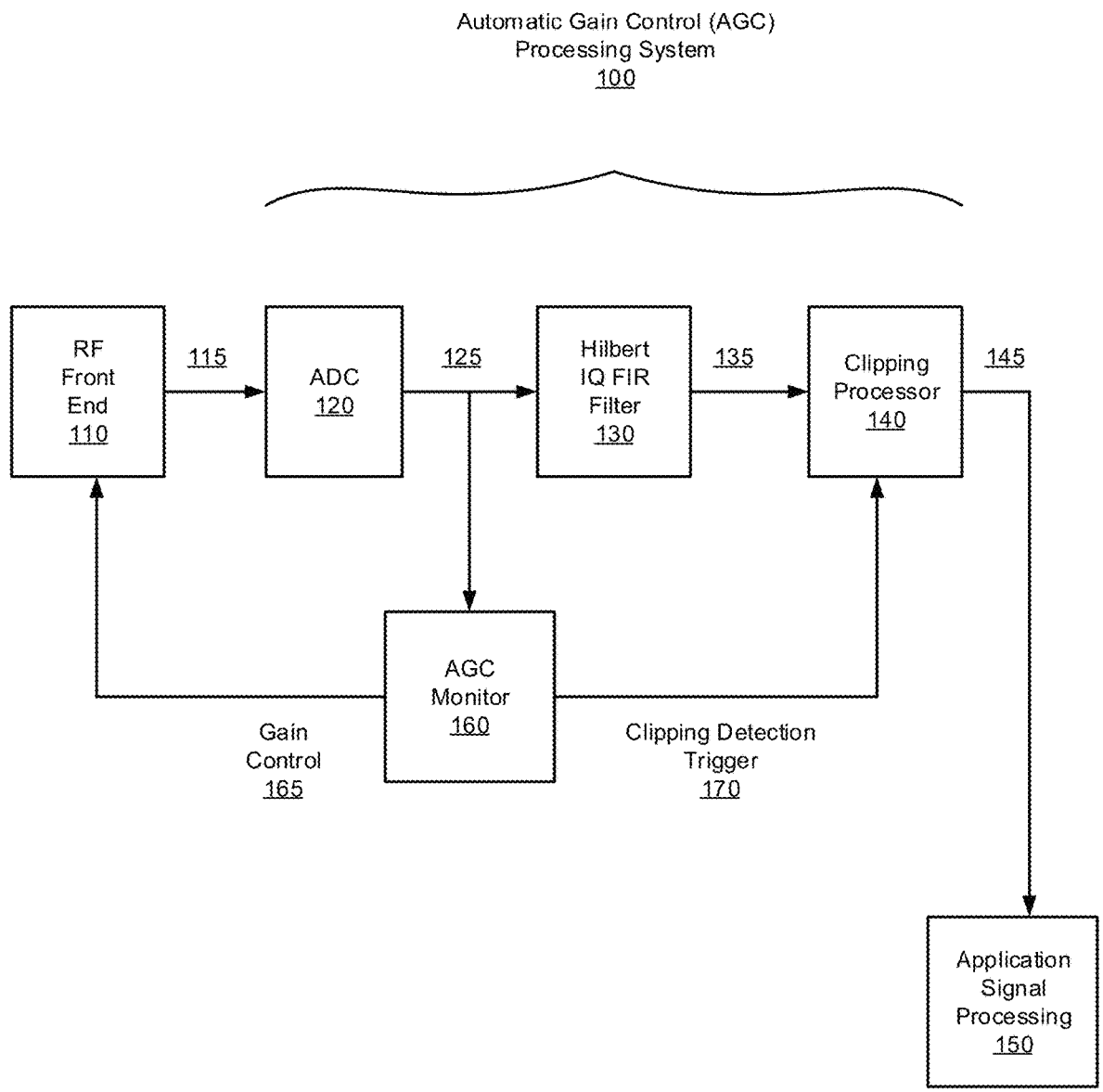
FIG. 1 illustrates an AGC processing system, in accordance with certain embodiments of the present disclosure.

Although the following Detailed Description will proceed with reference being made to illustrative embodiments, many alternatives, modifications, and variations thereof will be apparent in light of this disclosure.

DETAILED DESCRIPTION

Techniques are provided herein for automatic gain control processing to reduce the adverse effects associated with clipped samples that can occur during conversion of analog signals to digital signals. As noted previously, if an analog signal exceeds the voltage that can be represented by the maximum number of bits available in the ADC, the ADC will clip the resulting digital sample to the full scale value. The clipping causes unwanted distortion that can be detrimental to, or otherwise impair, the performance of subsequent or downstream signal processing stages that operate on the converted digital signal. One solution to this problem is to zero out all of the digital samples that could be affected by the clipped sample in the subsequent signal processing stages. While this approach provides significant improvement to the resulting signal to noise ratio, for example in systems performing anti jam processing and adaptive array signal processing, it does introduce an undesirable noise structure in the frequency response, which can have an adverse impact that tends to worsen as the number of clips and/or the number of zeroed samples per clip increase.

To this end, and in accordance with an embodiment of the present disclosure, techniques are provided to apply a window function that smoothly attenuates the samples in the region surrounding the clipped sample to avoid the abrupt step change or discontinuity that occurs with the sample zeroing approach. The use of an appropriate window function as provided herein alters the resulting noise structure from one related to a sinc function, with relatively high sidelobes, to a frequency response related to the Fourier transform of the chosen window function, which has significantly reduced sidelobes and more rapid frequency roll-off of undesired noise energy, thus increasing signal to noise ratio (SNR).

For example, a system to implement the disclosed techniques can be hosted on, or otherwise be incorporated into the electronic systems of an aircraft or other vehicle, a navigation system, an anti jamming system, a tracking ground station, a personal computer, workstation, laptop computer, tablet, touchpad, portable computer, handheld computer, cellular telephone, smartphone, embedded system, or any other platform where analog to digital signal conversion is performed. In a more general sense, the disclosed techniques are useful for any systems in which analog signals are converted to digital signals and mitigation of the adverse effects associated with clipped samples is required. In accordance with an embodiment, a methodology to implement these techniques includes identifying a clipped sample of the converted digital signal. In some embodiments, the clipped sample can be identified by comparison of the digitized sample values to a threshold value associated with the full scale value of the converter. The method also includes applying a window function to the digital signal. The window function is configured to attenuate samples of the digital signal within a region centered on the identified clipped sample. Parameters of the window function are selected based on SNR requirements of a downstream application that is to operate on the digital signal, wherein the SNR is affected by the frequency sidelobe characteristics of the window function. In some embodiments, a Hilbert finite impulse response (FIR) filter may be applied to the digital signal prior to applying the window function and the parameters of the window function are further based on the frequency response characteristics of the FIR filter.

It will be appreciated that the techniques described herein may provide improved systems and methods for AGC, compared to systems that simply zero out regions of the signal around clipped samples. The disclosed techniques can provide improved processing capabilities in a variety of signal processing applications including anti jamming systems, tracking systems, and navigation systems, to name a few examples. Numerous embodiments and applications will be apparent in light of this disclosure.

System Architecture

FIG. 1 illustrates an AGC processing system 100, in accordance with certain embodiments of the present disclosure. The AGC processing system 100 is shown to include an ADC 120, a Hilbert IQ FIR filter 130, a clipping processor 140, and an AGC monitor 160. Also shown in the figure is an RF front end 110, and back end application signal processing 150.

The ADC 120 is configured to convert an analog signal 115 into a digital signal 125, the digital signal comprising digital samples. The analog signal may be provided by any suitable signal source, for example, in some embodiments, the analog signal may be provided by an RF front end 110 that is configured to acquire signals of interest such as a communication signal or radar signal.

The Hilbert IQ FIR filter 130 is configured to transform the real-valued digital signal 125 into a complex valued filtered digital signal 135 comprising in-phase and quadrature components. In some embodiments, the FIR filter 130 is applied to the digital signal prior to applying the window function. In some embodiments, the FIR filter 130 may be omitted.

The AGC monitor 160 is configured to monitor the analog to digital conversion process, performed by ADC 120, to identify digital samples that are clipped (e.g., samples that would have exceeded the full scale value of the ADC 120 or some other pre-defined threshold value). The identification of clipped samples may be accomplished, for example, by comparisons of samples of the digital signal to a full-scale value of the analog to digital conversion process or using any other suitable technique in light of the present disclosure. In some embodiments, a gain control signal 165 may be provided to the RF front end 110, in response to detection of clipping by the AGC monitor 160. The gain control signal 165 may serve to instruct the RF front-end 110 to lower the gain to reduce the chance of further clipping. Additionally, a clipping detection trigger signal 170 may be provided by the AGC monitor 160 to the clipping processor 140, so that adverse effects of the clipped sample can be mitigated by the clipping processor 140.

The clipping processor 140 is configured to apply a window to a region of samples surrounding the clipped sample, to reduce the effect of the clipping, as will be described in greater detail below. The resulting clip processed signal 145 is provided to the application signal processing, block 150.

Application signal processing block 150 is configured to perform any desired application specific signal processing on the clip processed signal 145. For example, in some embodiments, block 145 may represent an anti-jamming application. In some other embodiments, the application may be communications signal processing or radar signal processing, to name just a few examples.

Figure 2:
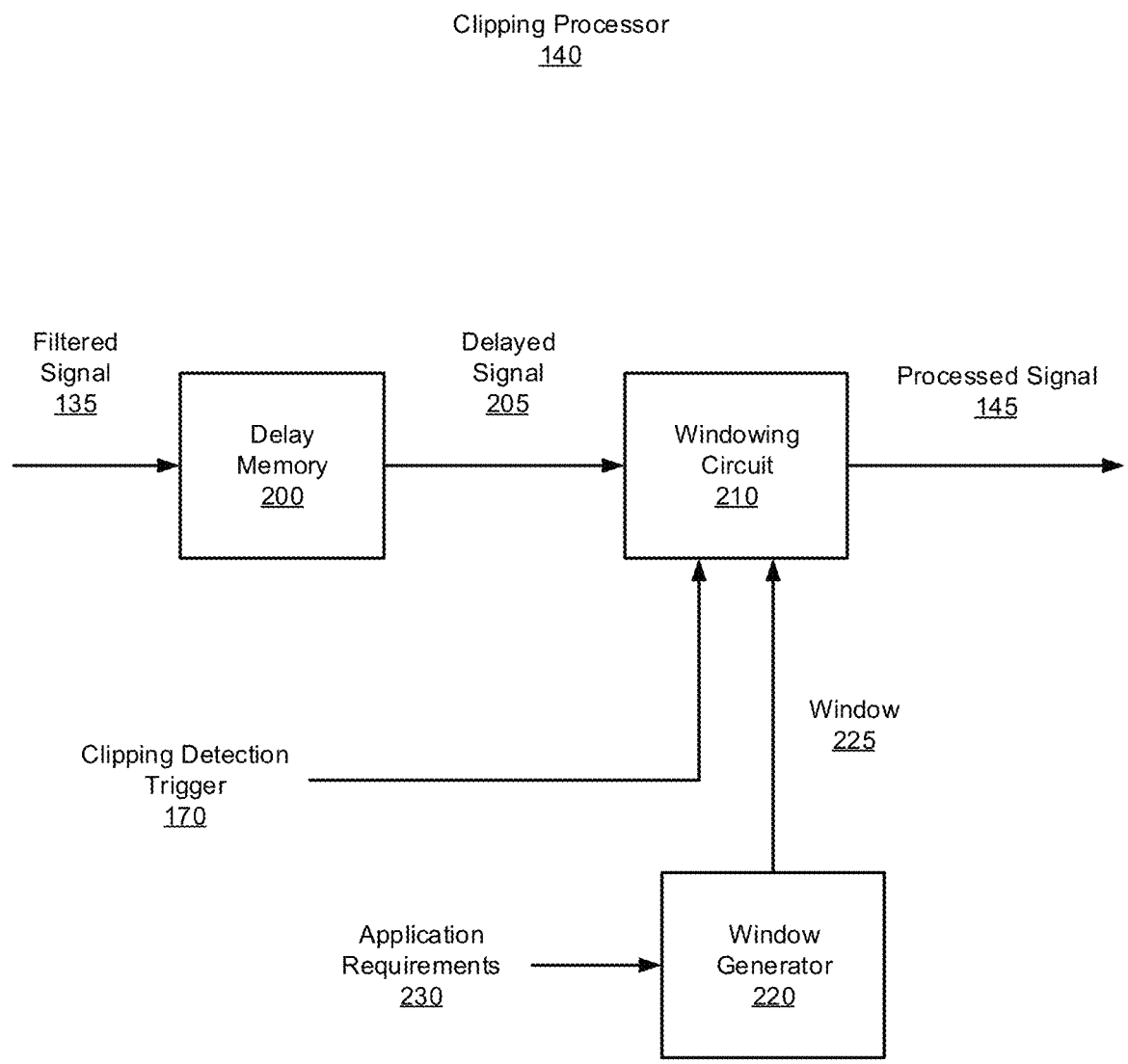
FIG. 2 is a block diagram of a clipping processor, configured in accordance with certain embodiments of the present disclosure.

FIG. 2 is a block diagram of the clipping processor 140, configured in accordance with certain embodiments of the present disclosure. The clipping processor 140 is shown to include a delay memory 200, a windowing circuit 210, and a window generator 220.

The delay memory 200 is configured to buffer the filtered digital signal 135 so that samples occurring in time prior to the detected clipping are still available. The delay memory is configured to store a selected number of samples N based on the length of the window function to be applied. For example, if the window function is of length N=128, the delay memory would store 128 samples of the filtered signal (labeled as delayed signal 205 in FIG. 2) and the clipped sample would be located at the midpoint, or approximately at the midpoint, of the buffer.

The windowing circuit 210 is configured to apply a window function 225 to the delayed signal 205 in response to the clipping detection trigger 170. The window function 225 (also referred to as the window) is configured to smoothly attenuate samples of the filtered digital signal 135 within a region centered on the identified clipped sample, or otherwise including the identified clipped sample. The maximum attenuation (e.g., 100 percent attenuation) generally occurs at the clipped sample at the center of the window and decreases with each sample moving away from the center. This is illustrated, for example, as window function 410 in FIG. 4, as will be described in greater detail below.

The window generator 220 is configured to generate the window function 225. In some embodiments, the window is a cosine-sum window such as a Hamming window, Blackman window, or Hann window. In some other embodiments, the window is a Gaussian window. Any suitable window may be used in light of the present disclosure. Parameters of the window function are selected based on the frequency response characteristics of the FIR filter 130 and on the frequency sidelobe requirements 230 (which in turn are driven by SNR requirements) of an application 150 that receives the windowed or clip processed signal 145, as will be explained in greater detail below.

Figure 3:
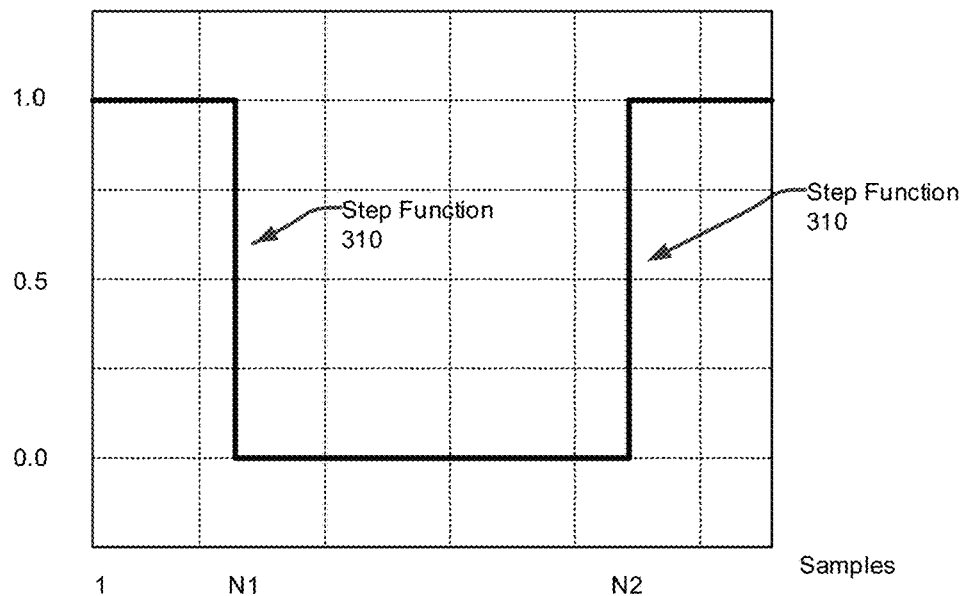
FIG. 3 illustrates zeroing of clipped signal samples.
Figure 3:
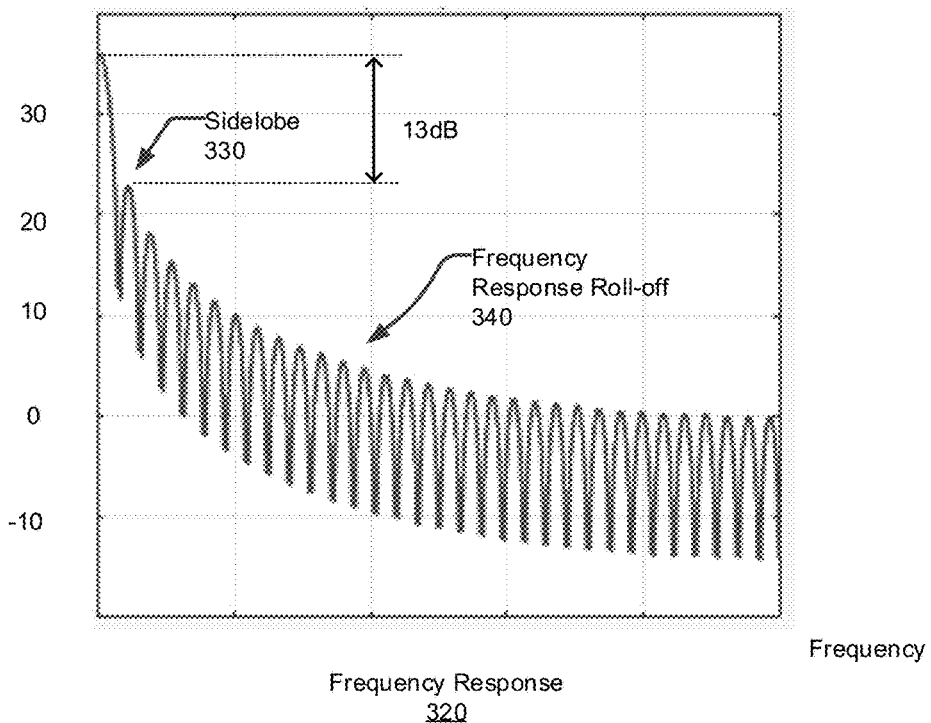

FIG. 3 illustrates a function 300 for zeroing of clipped signal samples. A pair of step functions 310 are shown, which transition from one to zero and from zero back to one, respectively. The step functions can be applied to the digital signal containing the clipped sample, to zero out samples N1 through N2, wherein the clipped sample is located at approximately the midpoint between N1 and N2.

The zeroing function could be considered an application of a rectilinear window comprising discontinuities at samples N1 and N2 (where the window values switch abruptly between one and zero). The term "window," however, as used herein, refers not to rectilinear windows, but rather to smooth windows of the type illustrated in FIG. 4 (e.g., window function 410), as described below.

The frequency response 320 of this zeroing function 300 is also shown. As can be seen, the frequency response 320 is a sinc function with a relatively high first sidelobe 330 (e.g., about 13 dB down from the peak frequency magnitude) and a slow roll-off 340 as frequency increases. The high sidelobe 330 and slow roll-off 340 are caused by the discontinuities of the step functions 310 and may be too high for some applications 150. For example, an anti jamming application may need to steer a beamforming null, having a depth of 50 dB, in the direction of a jamming signal. In order to form a null of that depth, it may generally be required that all signal processing operation in the path of the signal have sidelobes lower than 50 dB.

Figure 4:
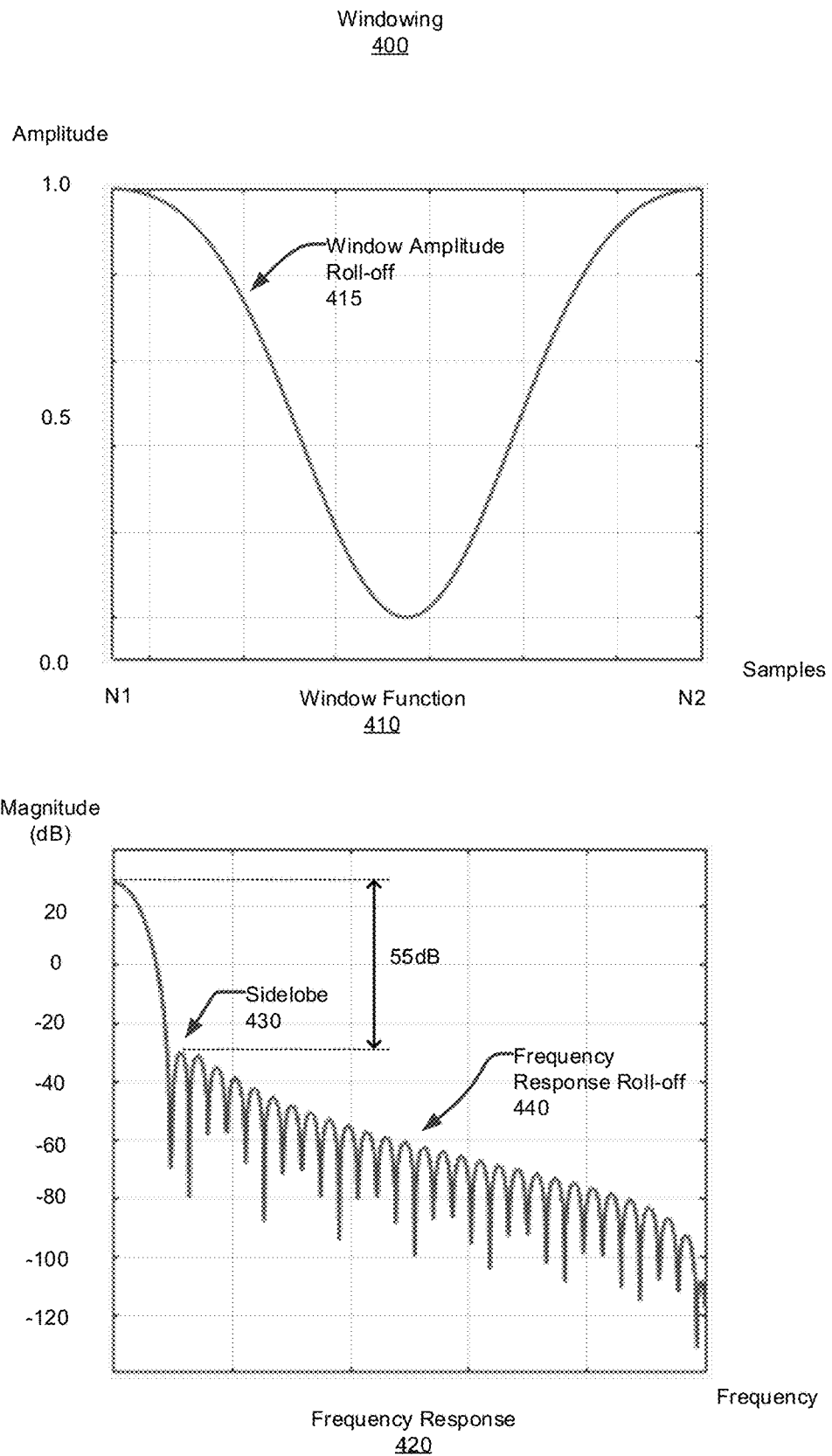
FIG. 4 illustrates the effect of window application to clipped signal samples, in accordance with certain embodiments of the present disclosure.

FIG. 4 illustrates the effect of window application 400 to clipped signal samples, in accordance with certain embodiments of the present disclosure. A window function 410 is shown, which transitions from one to zero and back to one, over a length of N2−N1 samples, in a smooth fashion (e.g., without discontinuities in the window amplitude roll-off 415). In some embodiments, the length of the window function (N2−N1) may be equal to, or otherwise based, on the length of the FIR filter 130, since the roll-off of the FIR filter coefficients impacts the number of samples of the digital signal that have an impact on further downstream processing. For example, the roll-off of the FIR filter coefficients combined with the window amplitude roll-off 415 determines the overall attenuation of samples as a function of distance from the clipped sample.

In some embodiments, the window is a cosine-sum window such as a Hamming window, Blackman window, or Hann window. In some other embodiments, the window is a Gaussian window, although other suitable windows may be used. The window function can be applied to the digital signal containing the clipped sample, to reduce the adverse effects of a clipped sample which is located at the midpoint between N1 and N2, or approximately at the midpoint. In some embodiments, the clipped sample may be located anywhere with the region between N1 and N2.

The frequency response 420 of the window function 410 is also shown. As can be seen, the frequency response 420 has a significantly lower sidelobe 430 (e.g., about 55 dB down from the peak frequency magnitude), and a more rapid frequency response roll-off 440 as frequency increases. The lower sidelobe 430 and faster frequency roll-off 440 result from the relative smoothness of the window function 410, and will be more suitable for use by a downstream application such as the anti jamming application previously mentioned since this will improve the SNR.

Figure 5:
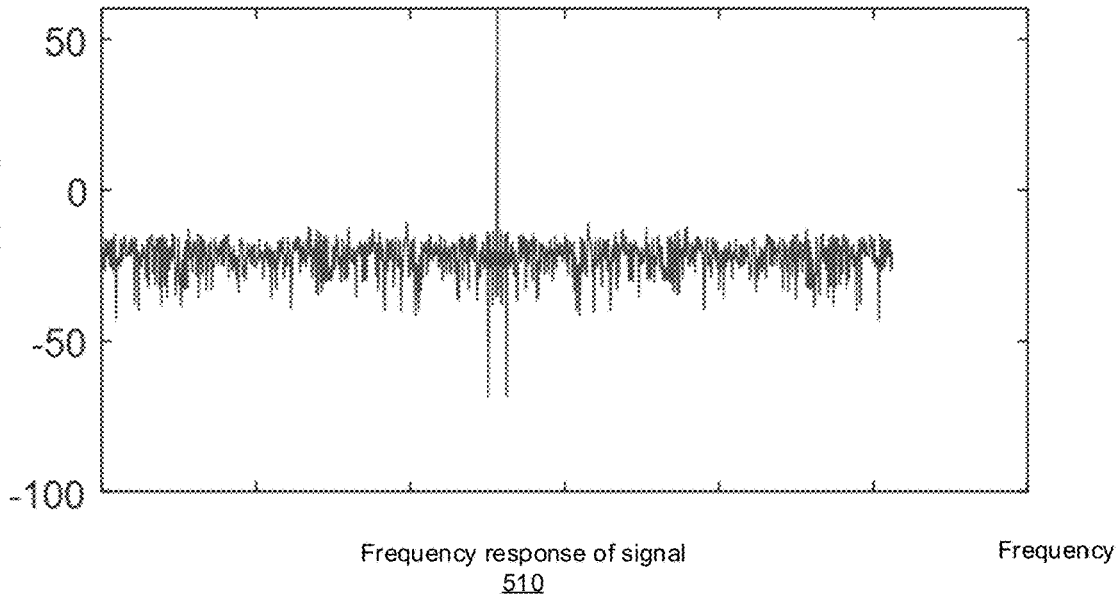
FIG. 5 illustrates a comparison of zeroing versus windowing techniques, in accordance with certain embodiments of the present disclosure.
Figure 5:
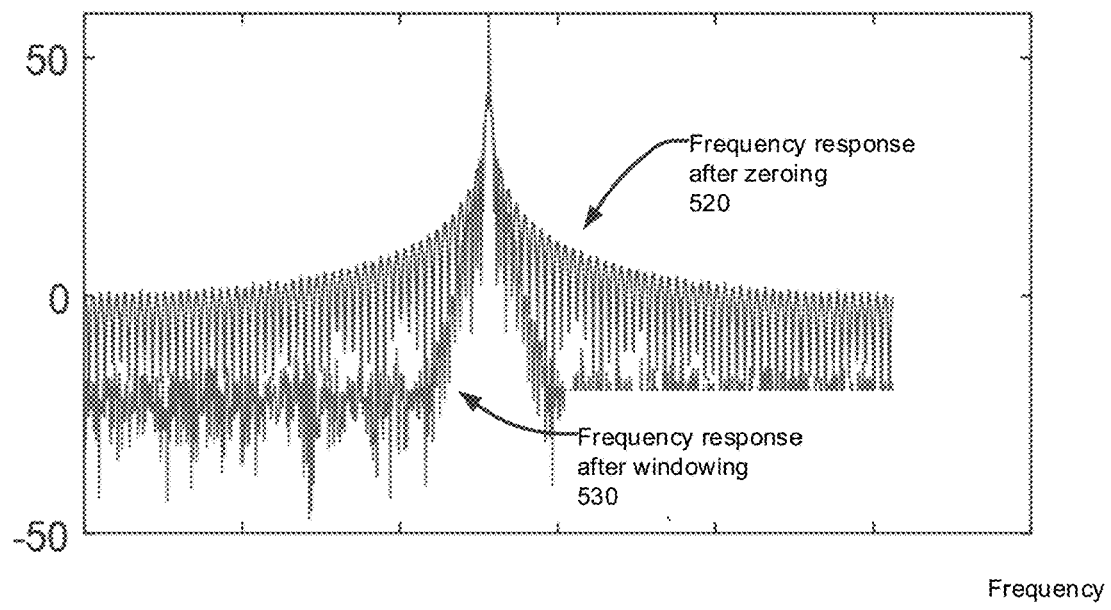

FIG. 5 illustrates a comparison 500 of zeroing versus windowing techniques, in accordance with certain embodiments of the present disclosure. The frequency response of a signal without clipping 510 is shown. For comparison, clipping is introduced and the frequency response of the signal after zeroing 520 is shown overlaid on the frequency response of the signal after windowing 530. As can be seen, the windowing process results in reduced sidelobes and more rapid frequency roll-off of undesired noise energy, which improves the effective SNR of the AGC process and is beneficial for downstream applications 150.

Methodology

Figure 6:
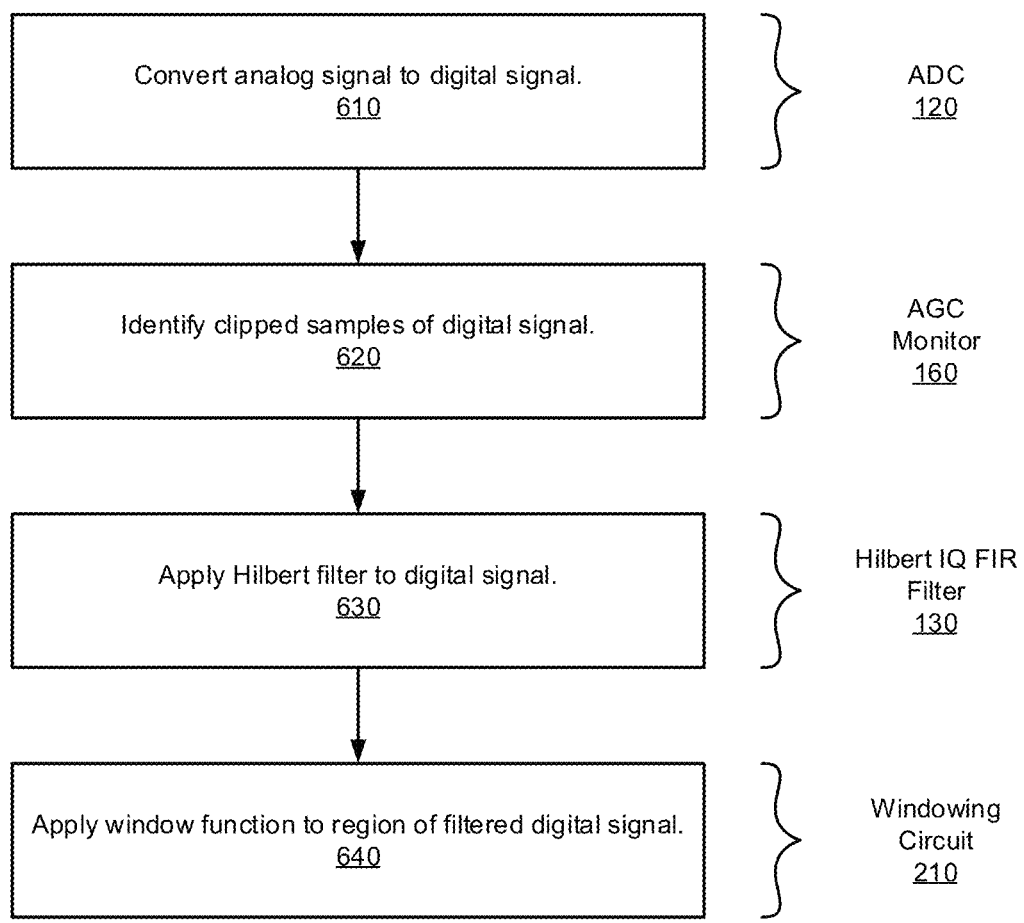
FIG. 6 is a flowchart illustrating a methodology for processing of clipped signal samples, in accordance with an embodiment of the present disclosure.

FIG. 6 is a flowchart illustrating a methodology 600 for AGC that includes processing of clipped signal samples, in accordance with an embodiment of the present disclosure. As can be seen, example method 600 includes a number of phases and sub-processes, the sequence of which may vary from one embodiment to another. However, when considered in aggregate, these phases and sub-processes form a process for AGC, in accordance with certain of the embodiments disclosed herein. These embodiments can be implemented, for example using the system architecture illustrated in FIGS. 1 and 2, as described above. However other system architectures can be used in other embodiments, as will be apparent in light of this disclosure. To this end, the correlation of the various functions shown in FIG. 6 to the specific components illustrated in FIGS. 1 and 2, is not intended to imply any structural and/or use limitations. Rather other embodiments may include, for example, varying degrees of integration wherein multiple functionalities are effectively performed by one system. Numerous variations and alternative configurations will be apparent in light of this disclosure.

In one embodiment, method 600 commences, at operation 610, by converting an analog signal to a digital signal comprising digital samples. In some embodiments, the analog signal may be provided by an RF front end of a system that employs the disclosed AGC processing system.

At operation 620, the analog to digital conversion process is monitored to identify digital samples that are clipped (e.g., that would have exceeded full scale value of the converter).

At operation 630, a Hilbert IQ FIR filter is applied to the digital signal, for example to transform a real-valued signal into a complex valued signal comprising in-phase and quadrature components.

At operation 640, a window function is applied to a region of the filtered digital signal. The window function is designed or configured to attenuate samples of the filtered digital signal within the region which includes the identified clipped sample. In some embodiments, the region is centered, or approximately centered, on the identified clipped sample. In some embodiments, the window function is a cosine-sum window or a Gaussian window.

Of course, in some embodiments, additional operations may be performed, as previously described in connection with the system. These additional operations may include, for example, buffering the digital signal, after the analog-to-digital conversion, in a delay memory. The delay memory is configured to store a selected number of samples based on the length of the window function.

In some embodiments, parameters of the window function are selected based on frequency response characteristics of the FIR filter and on SNR requirements of a downstream application that is to operate on the windowed digital signal. Note that that SNR of the downstream application is affected by the frequency sidelobe characteristics of the window function.

Example System

Figure 7:
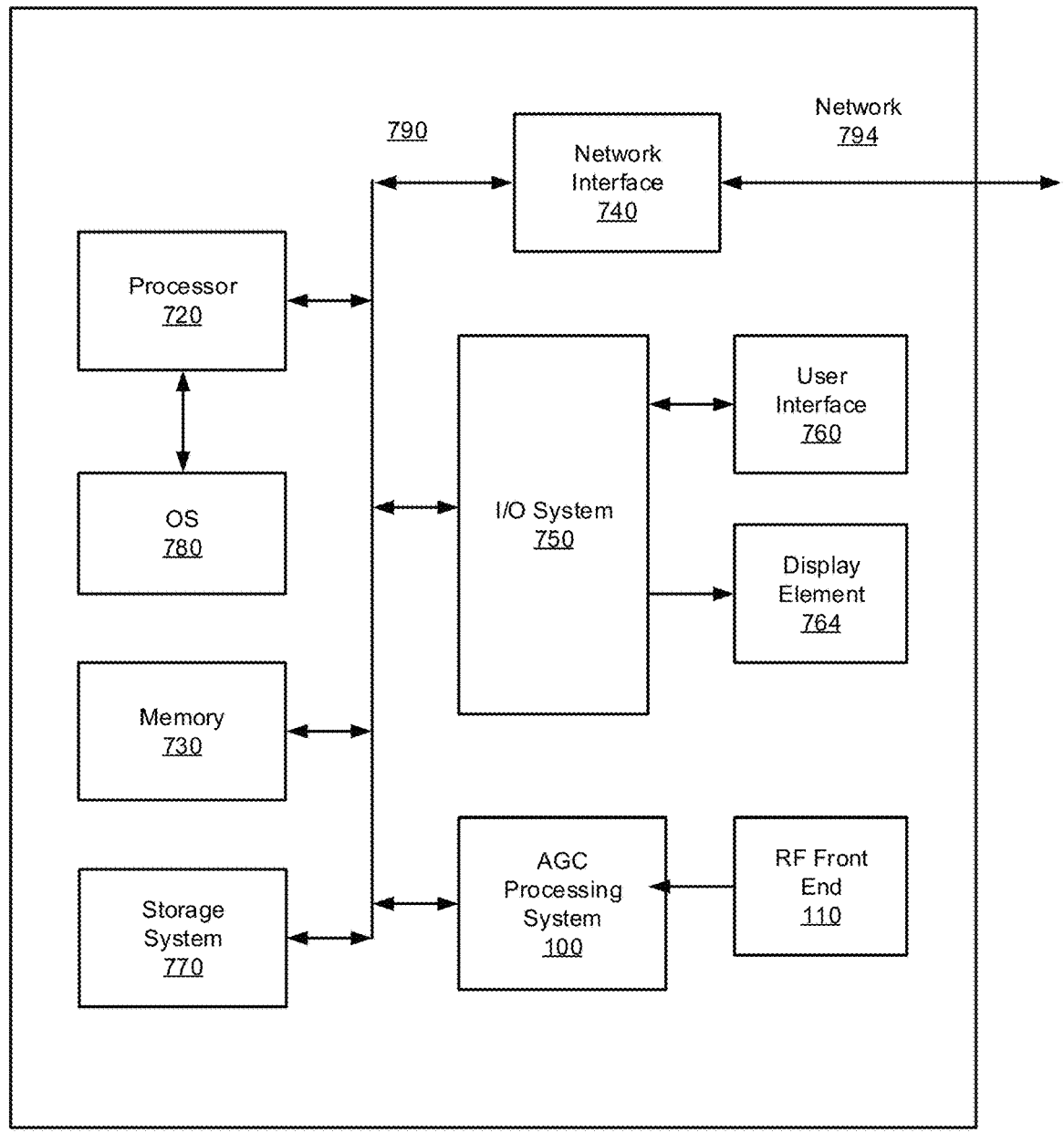
FIG. 7 is a block diagram schematically illustrating a processing platform configured to perform processing of clipped signal samples, in accordance with an embodiment of the present disclosure.

FIG. 7 is a block diagram schematically illustrating a processing platform 700 configured to perform processing of clipped signal samples, in accordance with an embodiment of the present disclosure. In some embodiments, platform 700, or portions thereof, may be hosted on, or otherwise be incorporated into an aircraft, the electronic systems of the aircraft, a tracking ground station, a personal computer, workstation, laptop computer, tablet, touchpad, portable computer, handheld computer, cellular telephone, smartphone, embedded system, or any other suitable platform where analog to digital signal conversion is performed. Any combination of different devices may be used in certain embodiments.

In some embodiments, platform 700 may comprise any combination of a processor 720, a memory 730, AGC processing system 100, a network interface 740, an input/output (I/O) system 750, a user interface 760, a display element 764, a storage system 770, and RF front end 110. As can be further seen, a bus and/or interconnect 790 is also provided to allow for communication between the various components listed above and/or other components not shown. Platform 700 can be coupled to a network 794 through network interface 740 to allow for communications with other computing devices, platforms, devices to be controlled, or other resources. Other componentry and functionality not reflected in the block diagram of FIG. 7 will be apparent in light of this disclosure, and it will be appreciated that other embodiments are not limited to any particular hardware configuration.

Processor 720 can be any suitable processor, and may include one or more coprocessors or controllers, such as an audio processor, a graphics processing unit, or hardware accelerator, to assist in control and processing operations associated with platform 700. In some embodiments, the processor 720 may be implemented as any number of processor cores. The processor (or processor cores) may be any type of processor, such as, for example, a microprocessor, an embedded processor, a digital signal processor (DSP), a graphics processor (GPU), a tensor processing unit (TPU), a network processor, a field programmable gate array or other device configured to execute code. The processors may be multithreaded cores in that they may include more than one hardware thread context (or "logical processor") per core. Processor 720 may be implemented as a complex instruction set computer (CISC) or a reduced instruction set computer (RISC) processor. In some embodiments, processor 720 may be configured as an x86 instruction set compatible processor.

Memory 730 can be implemented using any suitable type of digital storage including, for example, flash memory and/or random-access memory (RAM). In some embodiments, the memory 730 may include various layers of memory hierarchy and/or memory caches. Memory 730 may be implemented as a volatile memory device such as, but not limited to, a RAM, dynamic RAM (DRAM), or static RAM (SRAM) device. Storage system 770 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 770 may comprise technology to increase the storage performance enhanced protection for valuable digital media when multiple hard drives are included.

Processor 720 may be configured to execute an Operating System (OS) 780 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with platform 700, and therefore may also be implemented using any suitable existing or subsequently-developed platform.

Network interface circuit 740 can be any appropriate network chip or chipset which allows for wired and/or wireless connection between other components of platform 700 and/or network 794, thereby enabling platform 700 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution) and 5G, Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 750 may be configured to interface between various I/O devices and other components of platform 700. I/O devices may include, but not be limited to, user interface 760 and display element 764. User interface 760 may include devices (not shown) such as a touchpad, keyboard, and mouse, etc., for example, to allow the user to control the system. Display element 764 may be configured to display tracking data, navigation data, camera images, or other suitable information. I/O system 750 may include a graphics subsystem configured to perform processing of images for rendering on the display element 764. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 720 or any chipset of platform 700.

It will be appreciated that in some embodiments, the various components of platform 700 may be combined or integrated in a system-on-a-chip (SoC) architecture. In some embodiments, the components may be hardware components, firmware components, software components or any suitable combination of hardware, firmware or software.

AGC processing system 100 is configured to perform windowing operations to reduce the adverse effects that can result from clipped samples that occur during the analog to digital conversion process, as described previously. AGC processing system 100 may include any or all of the circuits/components illustrated in FIGS. 1 and 2, as described above. These components can be implemented or otherwise used in conjunction with a variety of suitable software and/or hardware that is coupled to or that otherwise forms a part of platform 700. These components can additionally or alternatively be implemented or otherwise used in conjunction with user I/O devices that are capable of providing information to, and receiving information and commands from, a user.

In some embodiments, these circuits may be installed local to platform 700, as shown in the example embodiment of FIG. 7. Alternatively, platform 700 can be implemented in a client-server arrangement wherein at least some functionality associated with these circuits is provided to platform 700 using an applet, such as a Java applet, or other downloadable module or set of sub-modules. Such remotely accessible modules or sub-modules can be provisioned in real-time, in response to a request from a client computing system for access to a given server having resources that are of interest to the user of the client computing system. In such embodiments, the server can be local to network 794 or remotely coupled to network 794 by one or more other networks and/or communication channels. In some cases, access to resources on a given network or computing system may require credentials such as usernames, passwords, and/or compliance with any other suitable security mechanism.

In various embodiments, platform 700 may be implemented as a wireless system, a wired system, or a combination of both. When implemented as a wireless system, platform 700 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, platform 700 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, application-specific integrated circuits (ASICs, or other purpose-built semiconductor), programmable logic devices, digital signal processors, field programmable gate arrays (FPGAs), logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 794. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments platform 700 may comprise additional, fewer, or alternative subcomponents as compared to those included in the example embodiment of FIG. 7.

The aforementioned non-transitory computer readable medium may be any suitable medium for storing digital information, such as a hard drive, a server, a flash memory, and/or random-access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method, process, and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional structures that include hardware, or a combination of hardware and software, and may comprise, for example, singly or in any combination, hardwired circuitry, programmable circuitry such as computer processors comprising one or more individual instruction processing cores, state machine circuitry, and/or gate level logic. The circuitry may include a processor and/or controller programmed or otherwise configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., non-volatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smartphones, etc. Other embodiments may be implemented as software executed by a programmable device. In any such hardware cases that include executable software, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood, however, that other embodiments may be practiced without these specific details, or otherwise with a different set of details. It will be further appreciated that the specific structural and functional details disclosed herein are representative of example embodiments and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

One example embodiment of the present disclosure provides a computer program product including one or more machine-readable mediums encoded with instructions that when executed by one or more processors cause a process to be carried out for processing of clipped signal samples, the process comprising: identifying a clipped sample of a digital signal, the clipping resulting from an analog-to-digital conversion of an analog signal to the digital signal; and applying a window function to a region of the digital signal, the region including the identified clipped sample, the window function configured to attenuate samples of the digital signal within the region.

In some cases, the window function is a cosine-sum window function or a Gaussian window function. In some cases, the process further comprises applying a Hilbert finite impulse response (FIR) filter to the digital signal prior to applying the window function. In some such cases, one or more parameters of the window function, including one or more frequency sidelobe characteristics, are selected based on frequency response characteristics of the FIR filter and on a signal to noise ratio (SNR) requirement of an application that receives the windowed digital signal. In some such cases, the process further comprises buffering the digital signal, after the analog-to-digital conversion, in a memory configured to store a number of samples based on a length of the window function. In some cases, the process further comprises identifying the clipped sample based on comparisons of samples of the digital signal to a full-scale value of the analog to digital conversion process. In some cases, the process further comprises providing the windowed digital signal to downstream application.

Another example embodiment of the present disclosure provides a system for processing of clipped signal samples, the system comprising: a monitoring circuit configured to identify a clipped sample of a digital signal, the clipping resulting from an analog-to-digital conversion of an analog signal to the digital signal; and a windowing circuit configured to apply a window function to a region of the digital signal, the region including the identified clipped sample, the window function configured to attenuate samples of the digital signal within the region.

In some cases, the system further comprises a window generator configured to generate the window function as a cosine-sum window function or a Gaussian window function. In some cases, the system further comprises a Hilbert finite impulse response (FIR) filter configured to filter the digital signal prior to applying the window function. In some such cases, one or more parameters of the window function, including one or more frequency sidelobe characteristics, are selected based on frequency response characteristics of the FIR filter and on a signal to noise ratio (SNR) requirement of an application that receives the windowed digital signal. In some cases, the system further comprises a memory configured to buffer the digital signal, after the analog-to-digital conversion, the memory configured to store a number of samples based on a length of the window function. In some cases, the monitoring circuit is configured to identify the clipped sample based on comparisons of samples of the digital signal to a full-scale value of the analog to digital conversion process.

Another example embodiment of the present disclosure provides a method for processing of clipped signal samples, the method comprising: identifying, by a processor-based system, a clipped sample of a digital signal, the clipping resulting from an analog-to-digital conversion of an analog signal to the digital signal; and applying, by the processor-based system, a window function to a region of the digital signal, the region including the identified clipped sample, the window function configured to attenuate samples of the digital signal within the region.

In some cases, the window function is a cosine-sum window function or a Gaussian window function. In some cases, the method further comprises applying a Hilbert finite impulse response (FIR) filter to the digital signal prior to applying the window function. In some such cases, one or more parameters of the window function, including one or more frequency sidelobe characteristics, are selected based on frequency response characteristics of the FIR filter and on a signal to noise ratio (SNR) requirement of an application that receives the windowed digital signal. In some cases, the method further comprises buffering the digital signal, after the analog-to-digital conversion, in a memory configured to store a number of samples based on a length of the window function. In some cases, the method further comprises identifying the clipped sample based on comparisons of samples of the digital signal to a full-scale value of the analog to digital conversion process. In some cases, the method further comprises providing the windowed digital signal to an anti jamming application.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A computer program product including one or more non-transitory machine-readable mediums encoded with instructions that when executed by one or more processors cause a process to be carried out for processing of clipped signal samples, the process comprising:
   identifying a clipped sample of a digital signal, the clipping resulting from an analog-to-digital conversion of an analog signal to the digital signal;
   applying a Hilbert finite impulse response filter to the digital signal; and
   applying a window function to a region of the digital signal filtered by the Hilbert finite impulse response filter (FIR), the region including the identified clipped sample, the window function configured to attenuate samples of the digital signal within the region.

2. The computer program product of claim 1, wherein the window function is a cosine-sum window function or a Gaussian window function.

3. The computer program product of claim 1, wherein one or more parameters of the window function, including one or more frequency sidelobe characteristics, are selected based on frequency response characteristics of the Hilbert FIR filter and on a signal to noise ratio (SNR) requirement of an application that receives the windowed digital signal.

4. The computer program product of claim 1, wherein the process further comprises buffering the digital signal, after the analog-to-digital conversion, in a memory configured to store a number of samples based on a length of the window function.

5. The computer program product of claim 1, wherein the process further comprises identifying the clipped sample based on comparisons of samples of the digital signal to a full-scale value of the analog to digital conversion process.

6. The computer program product of claim 1, wherein the process further comprises providing the windowed digital signal to downstream application.

7. A system for processing of clipped signal samples, the system comprising:
   a monitoring circuit configured to identify a clipped sample of a digital signal, the clipping resulting from an analog-to-digital conversion of an analog signal to the digital signal;
   a windowing circuit configured to apply a window function to a region of the digital signal, the region including the identified clipped sample, the window function configured to attenuate samples of the digital signal within the region; and
   a Hilbert finite impulse response (FIR) filter configured to filter the digital signal prior to applying the window function.

8. The system of claim 7, further comprising a window generator configured to generate the window function as a cosine-sum window function or a Gaussian window function.

9. The system of claim 7, wherein one or more parameters of the window function, including one or more frequency sidelobe characteristics, are selected based on frequency response characteristics of the Hilbert FIR filter and on a signal to noise ratio (SNR) requirement of an application that receives the windowed digital signal.

10. The system of claim 7, further comprising a memory configured to buffer the digital signal, after the analog-to-digital conversion, the memory configured to store a number of samples based on a length of the window function.

11. The system of claim 7, wherein the monitoring circuit is configured to identify the clipped sample based on comparisons of samples of the digital signal to a full-scale value of the analog to digital conversion process.

12. A method for processing of clipped signal samples, the method comprising:
   identifying, by a processor-based system, a clipped sample of a digital signal, the clipping resulting from an analog-to-digital conversion of an analog signal to the digital signal;
   applying a Hilbert finite impulse response (FIR) filter to the digital signal; and
   applying, by the processor-based system, a window function to a region of the digital signal filtered by the Hilbert FIR filter, the region including the identified clipped sample, the window function configured to attenuate samples of the digital signal within the region.

13. The method of claim 12, wherein the window function is a cosine-sum window function or a Gaussian window function.

14. The method of claim 12, wherein one or more parameters of the window function, including one or more frequency sidelobe characteristics, are selected based on frequency response characteristics of the Hilbert FIR filter and on a signal to noise ratio (SNR) requirement of an application that receives the windowed digital signal.

15. The method of claim 12, further comprising buffering the digital signal, after the analog-to-digital conversion, in a memory configured to store a number of samples based on a length of the window function.

16. The method of claim 12, further comprising identifying the clipped sample based on comparisons of samples of the digital signal to a full-scale value of the analog to digital conversion process.

17. The method of claim 12, further comprising providing the windowed digital signal to an anti jamming application.

* * * * *